United States Patent [19]
Wong et al.

[11] Patent Number: 5,239,561
[45] Date of Patent: Aug. 24, 1993

[54] PHASE ERROR PROCESSOR

[75] Inventors: Hee Wong; Tsun-Kit Chin, both of San Jose, Calif.

[73] Assignee: National Semiconductor Corporation, Santa Clara, Calif.

[21] Appl. No.: 731,138

[22] Filed: Jul. 15, 1991

[51] Int. Cl.$^5$ .............................................. H03D 3/20
[52] U.S. Cl. ........................................ 375/81; 375/82; 375/119; 375/120; 307/511; 328/155; 329/307; 329/309; 329/310; 329/325; 331/25; 331/1 H
[58] Field of Search ...................... 375/81, 80, 82, 119, 375/120; 328/72, 133, 139, 155; 329/307, 309, 310, 325; 307/510, 511; 331/14, 25, 1 H

[56] References Cited

U.S. PATENT DOCUMENTS

| | | | |
|---|---|---|---|
| 4,371,974 | 1/1983 | Dugan | 375/82 |
| 4,584,695 | 4/1986 | Wong et al. | 375/81 |
| 4,635,277 | 1/1987 | Blake et al. | 375/119 |
| 4,752,748 | 6/1988 | Grzeszykowski | 331/1 A |
| 4,940,948 | 7/1990 | Laws et al. | 329/307 |
| 5,003,557 | 3/1991 | Fujiyama | 375/120 |
| 5,003,562 | 3/1991 | van Driest et al. | 375/81 |

FOREIGN PATENT DOCUMENTS 274591 7/1988 European Pat. Off. .
402711 12/1990 European Pat. Off. .

OTHER PUBLICATIONS

European Search Report, Application No. EP 9230 6099, dated Sep. 21, 1992.

Primary Examiner—Curtis Kuntz
Assistant Examiner—Young Tse
Attorney, Agent, or Firm—Flehr, Hohbach, Test, Albritton & Herbert

[57] ABSTRACT

A phase error processor interfaces a proportionate phase detector to a digital loop filter in a high frequency phase-locked loop (PLL). The PLL receives a high frequency stream of NRZI encoded data, which contains a variable density of data signal transitions. A phase detector in the PLL generates proportionate phase error information in the form of a phase error pulse signal PD1 and a reference pulse signal PD2 for each data transition in the incoming data s The phase error processor, using a "decimation" technique, integrates the proportionate phase error information from just one pair of adjacent positive and negative data transitions during each period of N clock cycles if the number of input data transitions which occur during that time period exceeds the expected minimum, otherwise the phase error processor passes no phase error information. The selection of window width is based on the coding scheme of the incoming data stream. The integrated information is converted by the phase error processor once during each N-clock cycle period into a one-bit Up/Down signal that is then used to either advance or retard the output phase of the PLL's digitally controlled oscillator. The phase error processor also detects when the density of edges in the incoming data stream falls below a minimum allowed level, and generates a "data valid" signal indicating whether the Up/-Down signal are valid.

12 Claims, 6 Drawing Sheets

PHASE ERROR PROCESSOR

The present invention relates generally to very high frequency (e.g., greater than 50 MHz) phase-locked loops, and particularly to a phase error processor which functions as the interface between a proportionate phase detector and a digitally controlled oscillator.

BACKGROUND OF THE INVENTION

In many phase-locked loops (PLL's) and control systems, serial logic representation of the leading and lagging phase errors provides simple and low cost interface between a two-state quantized phase detector and a digitally controlled oscillator (DCO). The two logic states of the serial interface cause the output phase of the DCO to advance or retard in response to the sign of the phase error.

In many high speed data communication systems, such as the Fiber Distribution Data Interface (FDDI), duty-cycle distortions (DCD) and data-pattern dependent jitters (DDJ) are severe. In such systems, proportionate phase detectors are preferred over two-state quantized phase detectors. Proportionate phase detectors, however, may require the use of long digital words, which are costly to process. A serial interface, such as the one used in the quantized phase detector, is simple but fails to meet the DCD/DDJ requirements. As a result, there is a need to embed proportionate phase error information in serial logic signals so as to ensure compliance with DCD/DDJ specifications, and also to allow implementation of the PLL using digital logic circuitry.

One prior art technique that might be used or adapted to achieve this goal would be using a proportionate phase detector, followed by a charge pump and an one-bit A/D converter (comparator). However, the design of high frequency charge pumps (e.g., for operation at frequencies of 100 MHz and above) is no easy task and in most cases, suffers from performance problems (e.g., dead band problems). In addition, the p-channel and n-channel transistors of the complementary current sources used in such charge pumps are usually difficult to match, resulting in degradation of the PLL's dynamic tracking performance, and possibly leading to static alignment errors (SAE) and errors in receiving incoming data streams.

The charging time constant of such charge pumps also affects the PLL's loop characteristics. In many PLL's, the capacitor in the charge pump functions as the loop filter. For circuits implemented with digital loop filters, the additional loop filter component is undesirable.

Figure 1:
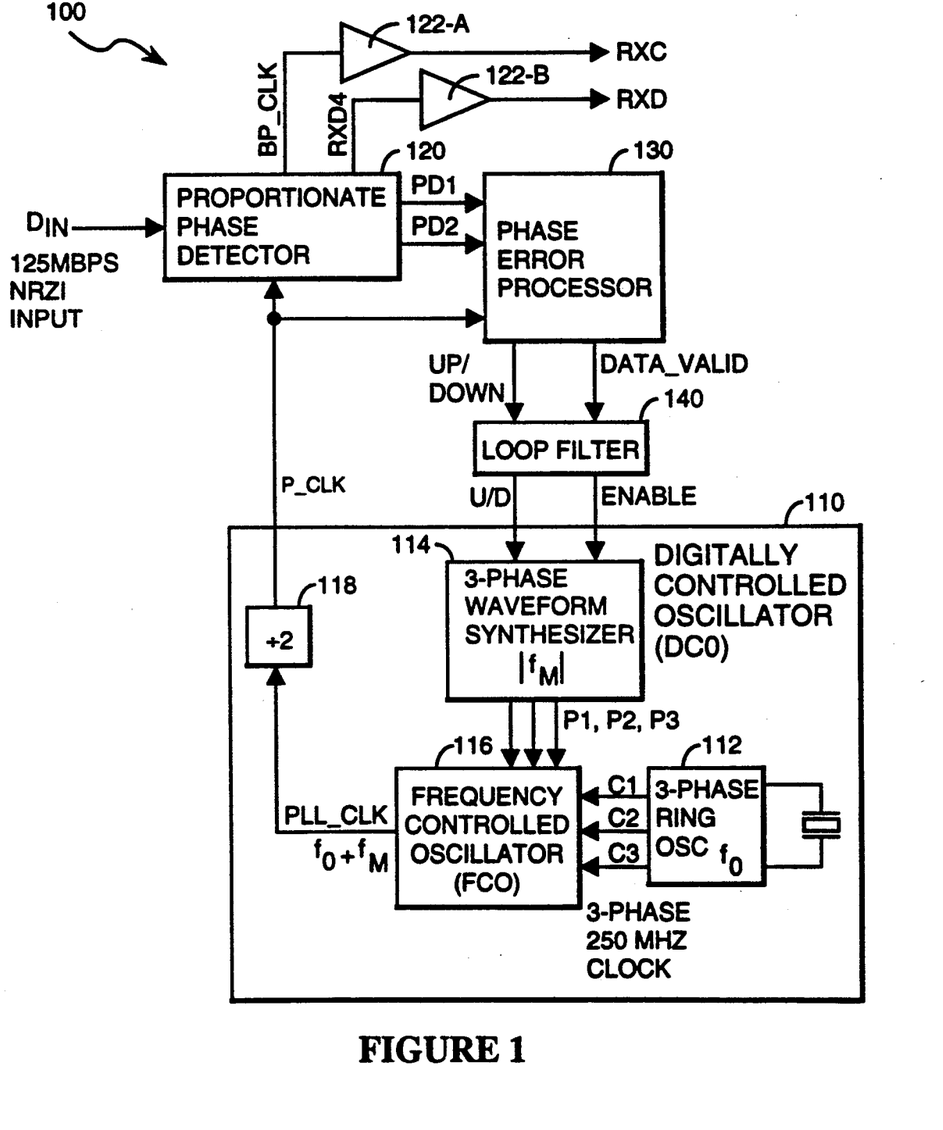
FIG. 1 is a block diagram of a phase-locked loop circuit incorporating a phase error processor in accordance with the present invention.

The phase error processor of the present invention interfaces a proportionate phase detector to a serial digital loop filter (see FIG. 1). It provides analog averaging of the phase error information to decode incoming data with heavy duty-cycle distortions and data dependent jitters. It reduces the operating frequency (and thus cost) of the digital loop filter by using a "decimation" technique. It also removes the common drawbacks of the conventional charge pumps described above. The processed phase error information (generated by the phase error processor) is represented by two logic signals, providing simple serial asynchronous interface to other digital function blocks of the PLL (such as a digital loop filter).

SUMMARY OF THE INVENTION

In summary, the present invention is a phase error processor which interfaces a proportionate phase detector to a digital loop filter in a high frequency phase-locked loop (PLL). The PLL receives a high frequency stream of NRZI encoded data, which contains a variable density of data signal transitions. A phase detector in the PLL generates proportionate phase error information in the form of a phase error signal PD1 and a reference signal PD2. Pulse signal PD1 has a pulse width TW1 that corresponds to the phase error between the data signal transition and the PLL clock signal. Pulse signal PD2 has a fixed width TW2 equal to half the period of the PLL clock signal.

The phase error processor, using a "decimation" technique, integrates the proportionate phase error information from just one pair of adjacent positive and negative data transitions during each period of N clock cycles if the number of input data transitions which occur during that time period exceeds the expected minimum, otherwise the phase error processor passes no phase error information. The selection of window width (N clock cycles) is based on the coding scheme of the incoming data stream. The integrated information is converted by the phase error processor once during each N-clock cycle period into a one-bit Up/Down signal that is then used to either advance or retard the output phase of the PLL's digitally controlled oscillator. The phase error processor also detects when the density of edges in the incoming data stream falls below a minimum allowed level, and generates a "data valid" signal indicating whether the Up/Down signal is valid.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Referring to FIG. 1, there is shown a high frequency, clock/data recovery phase-locked loop (PLL) 100. The function of the PLL 100 is to generate a periodic clock signal P_CLK which matches the frequency and phase of an incoming 125 megabit per second data signal $D_{IN}$. In the preferred embodiment, the data signal $D_{IN}$ is a NRZI coded data signal.

The primary components of the PLL 100 are a digitally controlled oscillator (DCO) 110, a proportionate phase detector 120, a phase error processor 130 and a digital loop filter 140. The DCO 110 generates the PLL's periodic clock signal P_CLK. The phase detector 120 generates phase error signals PD1 and PD2, and also generates recovered clock and data signals BP_CLK and RXD4, respectively, which are replicated as signals RXC and RXD, respectively, by buffer circuits 122-A and 122-B.

In the preferred embodiment, the DCO 110 contains a three-stage ring oscillator 112 that generates three equally phase spaced high frequency clock signals C1 to C3 having a frequency $f_O$ of about 250 megahertz. A waveform synthesizer 114 (also called a Digital Signed Phase-to-Frequency Converter), generates three equally phase spaced low frequency control signals having frequency $|f_M|$, where $f_M$ corresponds to the frequency error between the data signal $D_{IN}$ and $f_O$. More precisely, frequency $f_M$ is set by the PLL 100 to be approximately equal to $2f_{IN}-f_O$, where $f_{IN}$ is the clock frequency of the incoming data signal $D_{IN}$. In the preferred embodiment, the waveform synthesizer 104 is a low cost triangular wave digital synthesizer which generates triangular waveforms. Waveform synthesizer 114 is described more completely in application Ser. No. 07/681,095 filed Apr. 5, 1991.

A frequency controlled oscillator (FCO) 116 generates a clock signal PLL_CLK whose frequency is equal to $f_O+f_M$, where $f_M$ is positive or negative in accordance with the sign of the quantity $2f_{IN}-f_O$. The PLL_CLK clock signal is divided by two by circuit 118 to generate the P_CLK signal, which is a squarewave signal that should match the frequency $f_{IN}$ (of about 125 MHz) and phase of the data signal $D_{IN}$. FCO 110 is described more completely in application Ser. No. 07/703,404, filed May 21, 1991.

Figure 2:
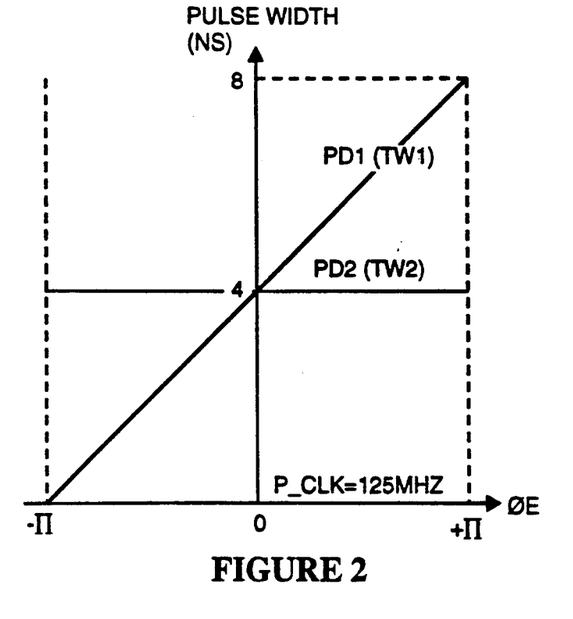
FIG. 2 shows a preferred phase detector's transfer characteristics.

The phase detector 120 continually compares the phase of the P_CLK signal with the phase of the input signal $D_{IN}$. For every edge transition at the data input Din, the phase detector 120 responds by generating active-high pulses at PD1 and PD2. The pulse width of PD1, TW1, is dependent on the phase difference between Din and P_CLK (i.e., the PLL's phase-locked clock). The pulse width of PD2, TW2, is always equal to half clock period and can be used as a reference signal. When the PLL 100 is in lock, both PD1 and PD2 have equal pulse widths (under ideal conditions). The phase error, if any, between the data signal transition and P_CLK, is proportional to the quantity TW1-TW2. FIG. 2 shows a plot of the pulse widths of PD1 and PD2 versus phase error $\phi E$ for the case of Din at 125 megabits per second.

PD1 and PD2 are processed by phase error processing circuit 130 to produce up/down frequency/phase adjustment signals Up/Down and Data_Valid. The outputs of the phase error processor 130 are two logic signals, Up/Down and Data_Valid. The two logic states of Up/Down indicate the leading or lagging phase error, whereas the logic states of Data_Valid validate the output at Up/Down. After being filtered by the digital loop filter 140, these frequency/phase adjustment signals are used to adjust the phase and frequency of the P_CLK signal generated by the DCO 110.

The phase error processor 130 uses several circuit techniques which are described in detail in the following sections:
1. Phase Error Gating.
2. Phase Error Averaging and Quantization.
3. Asynchronous two-bit logic Interface.

Phase Error Gating

In FDDI systems, a 4B/5B coding scheme and NRZI code bits are used for clock synchronization purpose as well as reducing dc content in the interface. Logic one and zero are respectively represented by the presence and absence of an edge transition. A line symbol is made up of a group of 5 code bits that may represent a data quartet, line state, or control information.

For each transmitted data symbol (encoded using five bits, at a rate of approximately 8 nanoseconds per bit), the coding scheme guarantees at least two edge transitions per data symbol for clock recovery purpose. During the transmission of line state symbols, however, the density of edge transitions may become one per clock period for Idle Line State, one per five clock periods for Halt Line State or one per ten clock periods for Master Line State. To summarize, the expected duration between edges for the incoming bit stream ranges from one to ten clock periods. The edge density may, however, increase or decrease due to the presence of transmission errors.

Continuous processing of the phase errors from the FDDI bit stream would require a very high speed digital loop filter circuit, which would be costly to implement. In addition, the loop gain in such an implementation would be dependent on the incoming edge density, causing the PLL's loop characteristics and loop performance to vary with the incoming edge density. Such variability in the PLL's loop characteristics and loop performance is undesirable.

The phase error processor 130 of the present invention uses a "decimation" technique to overcome these problems and to reduce the operating speed of the digital loop filter. Referring to the block diagram in FIG. 3, the primary components of the phase error processor 130 are a phase error gating circuit 132, a 44 cycle window counter 134, a time slot decoder 136, a differential charge and dump circuit 138, a comparator 142 and a flip-flop 144.

Figure 3:
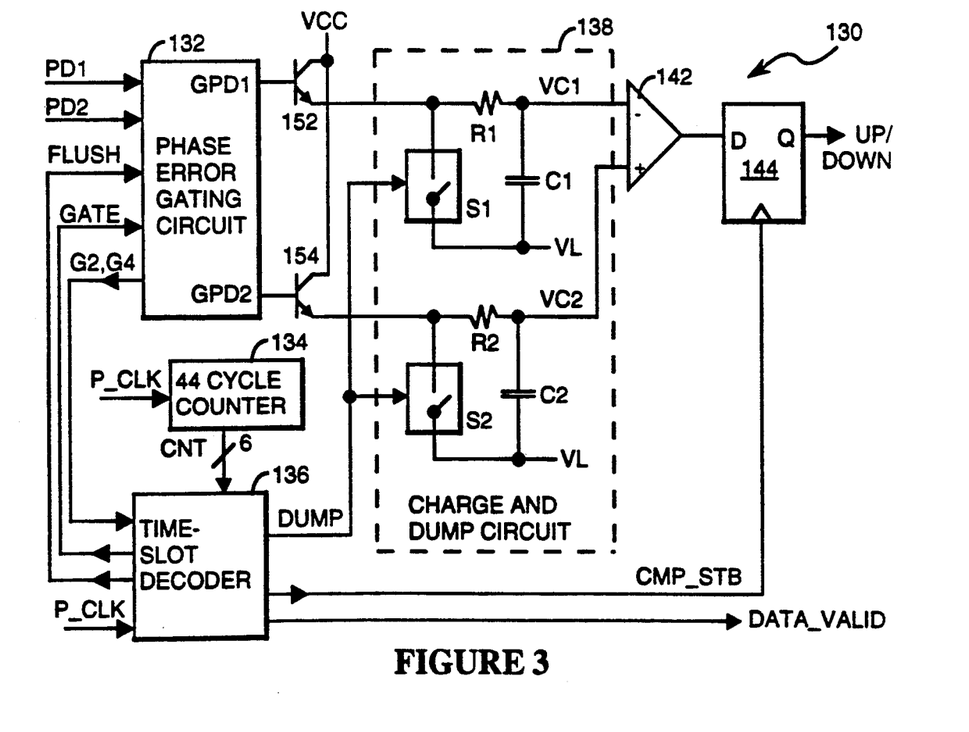
FIG. 3 is a simplified block diagram of a preferred embodiment of the phase error processor of the present invention.

The counter 134 and time slot decoder 136 set up a window for every 44 clock periods of P_CLK. The phase error gating circuit 132 gates the incoming pulses at PD1 and PD2, and allows only two pulses to pass through the phase error processor 130 during each 44-cycle window. The pair of pulses at GPD1 and GPD2 represent phase error samples for two adjacent positive and negative data transitions at Din.

The selection of window width is based on the coding scheme. For FDDI systems, a window width of 44 clock periods ensures that it can handle the lowest edge density of one per ten clock periods reliably. For a 44-cycle window, there is a minimum of four input data edges, including one data edge used to open the gating circuit 132, allowing two subsequent data edges to pass through the gating circuit 132, and a fourth edge to close the gating circuit 132.

Gating the phase error information has several advantages. First, the phase error information is updated once every window at a rate of $f_{P\_CLK}/44$ (e.g., 125 MHz/44, or about 2.84 MHz for FDDI). Thus, it significantly reduces the processing frequency of the digital loop filter. Second, it allows the use of a differential charge and dump circuit 138 in place of a charge pump, removing many constraints associated with charge pump designs (see "Background of The Invention", above). Another important advantage is that the processed data edge density is constant, two edges per 44-clock period window, eliminating the dependence of loop gain on the incoming edge density. In addition, the gating circuit 132 prevents erroneous data streams with edge density less than four per 44 clock periods from propagating through the phase error processor to the loop filter 140.

Figure 4:
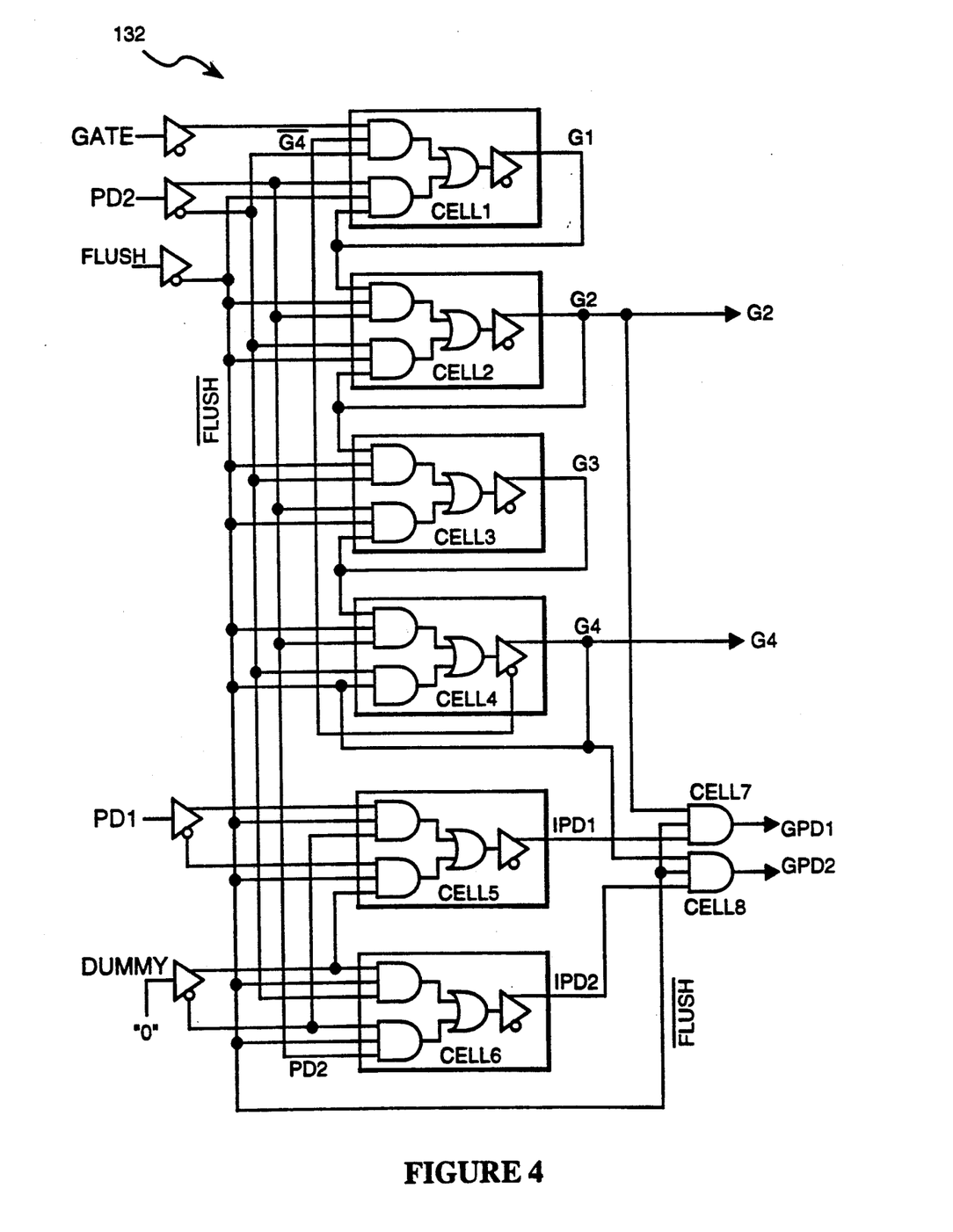
FIG. 4 is a logic-level diagram of a preferred embodiment of a phase error gating circuit used in the preferred embodiment of the present invention.

FIG. 4 shows the logic diagram of the phase error gating circuit 132 built with six identical three-input AND/OR cells CELL1-CELL6, and two AND gates CELL7, CELL8. The simple cell structure of this circuit is preferred for processing high frequency input pulses with minimum pulse distortion. Other gate types such as NAND/NAND gates could also be used. The equivalent functional diagram for this circuit is shown in FIG. 5.

As mentioned previously, the PD1 signal carries the phase error information, while the PD2 signal serves as a reference signal. PD2 is also utilized as the clock for the phase error gating circuit 132. CELL1-CELL4 function much like a two-bit shift register clocked by PD2 in which the shift register's final output signal G4 is fed back into the shift register's data input port in inverted form. Thus, it takes four PD2 "clock cycles" for the "two bit shift register" CELL1-CELL4 to cycle through its four states.

Figure 5:
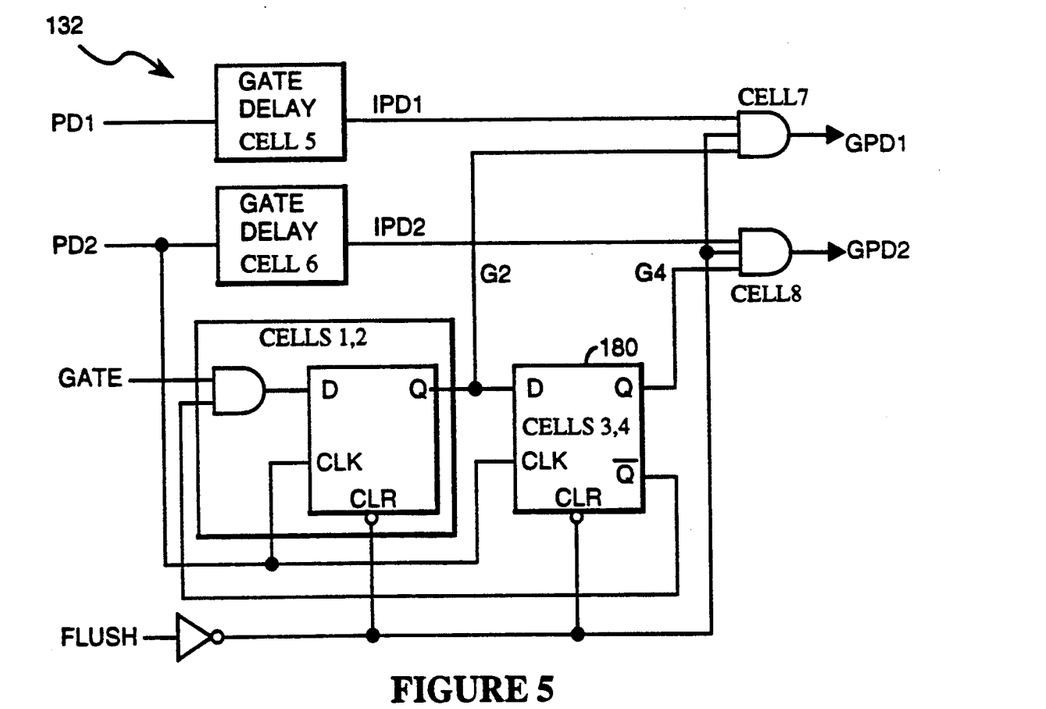
FIG. 5 is a schematic diagram of a circuit that is logically equivalent to the circuit of FIG. 4.
Figure 6:
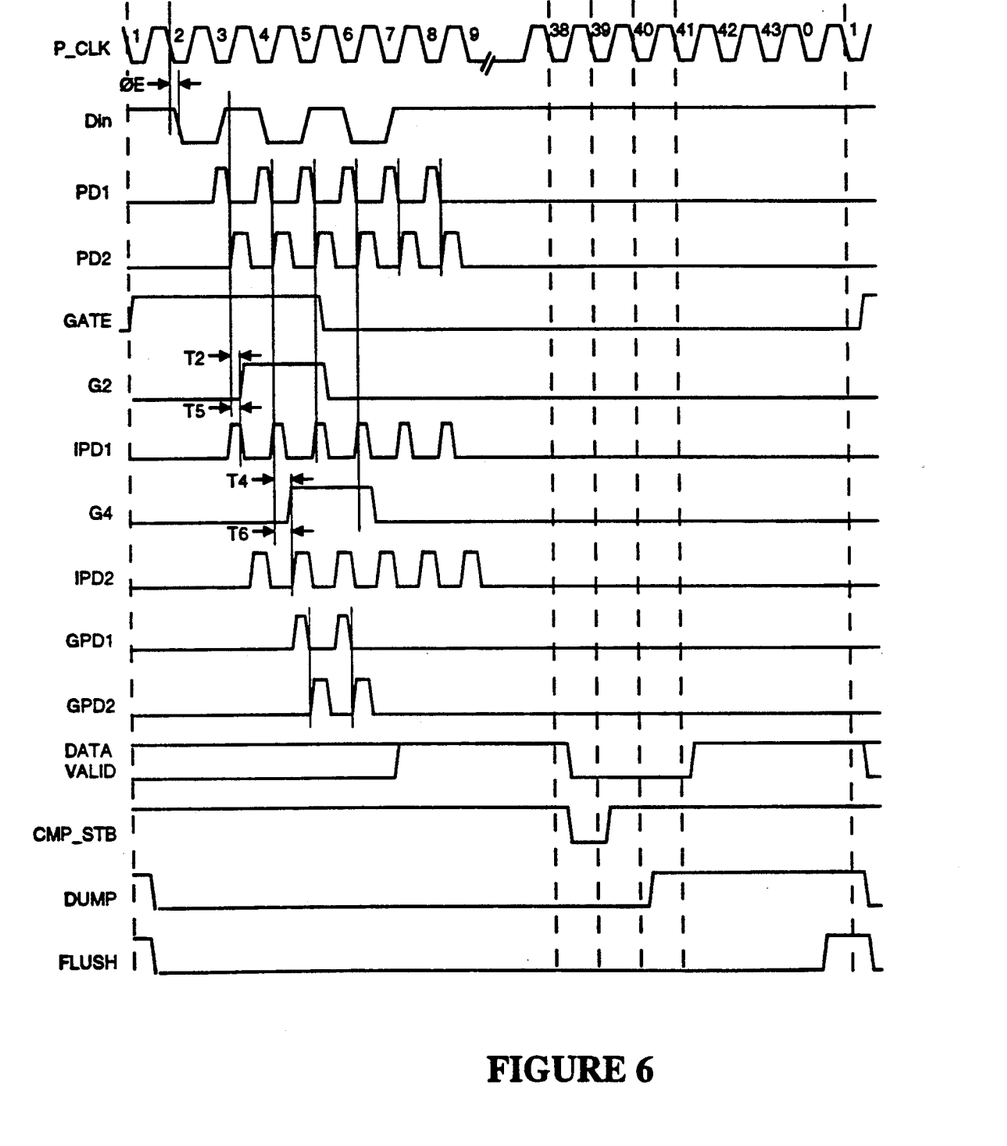
FIG. 6 is a timing diagram depicting operation of the phase error processor circuit during normal operation.

Referring to FIGS. 4, 5 and the timing diagram in FIG. 6, the phase error gating circuit 132 and the time slot decoder 136 work as follows. At the beginning of the window, the GATE signal from the time slot decoder 136 goes high, enabling the phase error gating circuit 132. The first rising edge of PD2 turns G2 valid, allowing subsequent pulses at PD1 to propagate through CELL7. The second rising edge of PD2 turns G4 valid, allowing subsequent pulses at PD2 to propagate through CELL8.

After G4 goes high, the time slot decoder resets GATE to logic "0". The third rising edge of PD2 resets G2, inhibiting any further pulses at PD1 from propagating through CELL7. The fourth rising edge of PD2 disables G4, inhibiting any further pulses at PD2 from propagating through CELL8. At the end of the window, the time slot decoder generates an active-high FLUSH signal that resets the gating circuit 132 to its initial state.

Using identical cells, the circuit shown in FIG. 4 can achieve good signal integrities at GPD1 and GPD2, resulting in minimum Static Alignment Errors (SAE). The cells are matched in such a way that the pulse widths TW1 and TW2 (at GPD1 and GPD2) are equal under locking condition.

In the preferred embodiment, the time slot decoder 136 is implemented using a programmed logic array configured as a synchronous circuit clocked at 125 MHz. Table 1 contains a listing of equations which define the relationships between the input and output signals of the time slot decoder 136.

Phase Error Averaging and Quantization

Figure 7:
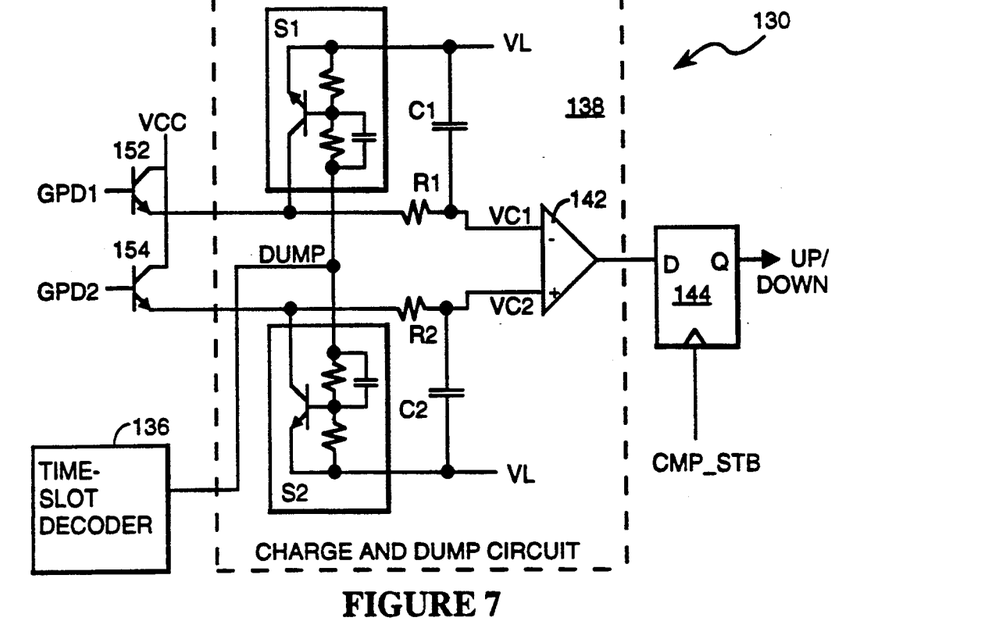
FIG. 7 is a circuit diagram of a charge and dump circuit used in the preferred embodiment.

Processing two pulses per window allows the use of a differential charge and dump circuit 138 for averaging the phase errors. As shown in FIGS. 3 and 7, the differential charge and dump circuit 138 consists of two RC circuits R1-C1 and R2-C2 driven by GPD1 and GPD2 (after two open emitter buffer stages 152 and 154), respectively, and switches S1 and S2 for discharging the two RC circuits. R1-C1 and R2-C2 are matched and perform integration functions during the periods when GPD1 and GPD2 are active-high. This arrangement allows integration with the same transistor type (either p-channel or n-channel), eliminating the need for matching different polarity transistors as in the charge pump approach. Switched current sources can also be used in place of resistors R1, R2 and the open-emitter buffers.

The phase errors in terms of pulse widths TW1 and Tw2 are converted to voltages at VC1 and VC2. The RC integration of the two pulses at GPD1 or GPD2 performs averaging of the proportionate phase errors derived from the two adjacent positive and negative data transitions propagated during the windows. This is essential for the PLL to locate the statistical center of the incoming eye-opening under severe DCD/DDJ distortions.

The GPD2 signal has a constant pulse width TW2 equal to a half clock period, which is equal to 4 ns for Din at 125 megabits per second. The total charging time for VC2 is thus one clock period ($2 \times TW2 = 8$ ns) per window.

The pulse width of the GPD1 signal, TW1, is dependent on the phase error and has a range of 0 to $2 \times TW2$, corresponding to the phase errors of $-\pi$ to $+\pi$ as shown in FIG. 2. The total charging time for VC1 thus ranges from 0 to two clock periods ($4 \times TW2 = 16$ ns) per window.

When the PLL 100 is in lock, the pulse widths TW1 and TW2 are equal, resulting in equal voltages at VC1 and VC2. Referring to FIG. 3, a comparator is used to compare the voltages at VC1 against VC2. CMP_STB strobes the comparator's output into flip-flop 144 after VC2 and VC1 are settled. CMP_STB is generated by the time slot decoder 136 and is activated once every window. Up/Down is the output of the flip-flop 144. Its logic states indicate the sign of the averaged phase errors of the two adjacent positive and negative data transitions.

For the sake of simplicity, if we assume linear charging, $$VC1 = VOH\,(TW1a + TW1b)/R1C1$$

$$VC2 = VOH\,(2 \times TW2)/R2C2$$

$$\text{Up/Down} = SGN\,\{VC2 - VC1\}$$

$$= SGN\,\{K(\times 2TW2 - (TW1a + TW1b))\}$$

where, TW1$a$, TW1$b$ are the pulse widths at GPD1 corresponding to the two adjacent data transitions at Din; VOH is the output high voltage of the open-emitter buffers 152 and 154 for GPD1 or GPD2; and k is a conversion constant ($k = VOH/R1C1 = VOH/R2C2$)).

From the above equation it can be seen that the differential charge and dump circuit 138 is tolerant to the absolute values of the RC time constants, as long as the two RC circuit R1-C1 and R2-C2 are matched. Since the circuit only evaluates the sign of the phase error, implementing the RC time constants with resistors (R1 and R2) or current sources whose values are process dependent does not pose any significant impact on circuit performance.

Ideally, the RC time constants are chosen such that the voltage at VC1 is maximized but not exceeding the maximum input common mode voltage of the comparator. Because of known charging durations, the voltage at VC1 can be maximized by selecting the smallest possible RC time constants, taking into account expected circuit parameter variations.

Figure 8:
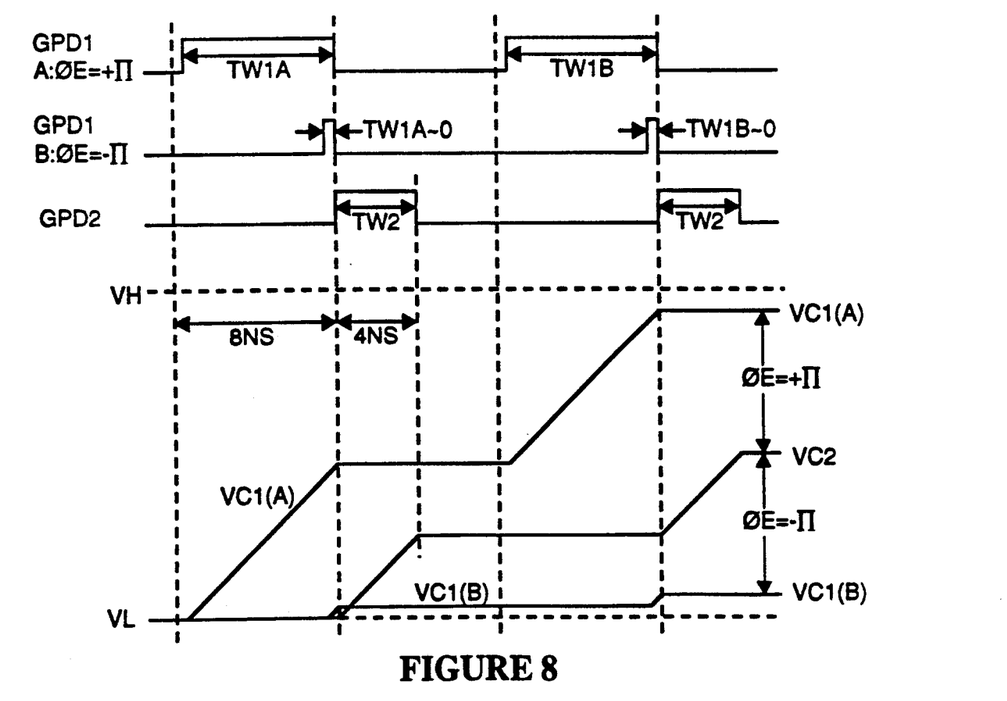
FIG. 8 is a timing diagram depicting operation of the charge and dump circuit in the phase error processor.

FIG. 8 shows timing diagrams of VC1 and VC2 at the extreme phase errors of $-\pi$ and $+\pi$. The resolution of the charge and dump circuit 138 is calculated by dividing the quantity (VC1−VC2) by $\phi$E. Maximizing VC1 reduces the impact of circuit imperfections, such as the comparator's offset and any mismatches of the integrator's RC time constants, on static alignment errors (SAE). As an example, if ECL buffer stages are used for GPD1 and GPD2, the maximum possible dynamic range (VOH minus VOL) that can be used for the extreme values of VC1 (corresponding to the extreme phase errors of $-\pi$ to $+\pi$) is 600 mV. Since the extreme values of VC1 corresponds to TW1 pulse widths varying by from zero to 8 nanoseconds, the maximum possible resolution of the RC integrator R1-C1 is 600 mV divided by 8 nanoseconds, or 75 mV/nanosecond. Using this best-case resolution for ECL circuitry, a comparator offset of ±30 mV would result in a static alignment error (SAE) of approximately ±0.4 nanoseconds.

At the end of the window, switches S1 and S2, controlled by the DUMP signal from the time slot decoder 136, are closed to discharge C1 and C2. As a result of the charge dumping, all the RC components in the phase error processor should have no effect on the loop characteristics (the loop filter's low-pass cut-off frequency is normally much lower than that imposed by the 44-clock period window).

Asynchronous Two-Bit Logic Interface

The PLL's front end (the phase detector 120 and phase error processor 130) are synchronous to the phase-locked clock, P_CLK. Other logic blocks, such as the digital loop filter 140 and DCO 110, are preferably synchronous to the local clock (from a crystal source) to prevent any possible start up problems. Therefore the interface between the phase error processor and the digital loop filter is asynchronous.

To prevent any possible meta-stable problems in the asynchronous interface, the time slot decoder 136 generates a signal called Data_Valid. When the comparator is updating the logic state of the Up/Down signal, the Data_Valid signal is disabled for three clock periods (see FIG. 6 for timing diagrams). The process of disabling Data_Valid for 3 clock periods introduces a gain factor (Ke) of 41/44 in the loop gain calculation.

When there are no edge transitions at Din, and whenever there is erroneous transmission that reduces the incoming edge density below four data transistions per 44 clock periods, the time slot decoder outputs an inactive Data_Valid signal. As a result, no incremental phase error information will be sent to the DCO 110 through the digital loop filter. The DCO 110 can stay at its previous frequency until Data_Valid and Up/Down are updated in the next window. This no-drift characteristic is hardly achievable in analog loops.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

TABLE 1

Time Slot Decoder - PLA Equations

Input Signals:
CNT    six bit counter value which ranges in value from 0 to 43

TABLE 1-continued

Time Slot Decoder - PLA Equations

G2    signal from gating circuit
G4    signal from gating circuit

Output Signals:
FLUSH    resets gating circuit at end of window
GATE    enables gating circuit at beginning of window
DATA_VALID validates Up/Down signal
DUMP    dumps stored charge
CM_STB    strobes comparator output into flip flop
DAT_VALID    intermediate value used to track number of edges in incoming data stream during each 44-cycle window
G2F    intermediate signal which is enabled after second PD2 pulse and disabled after third PD2 pulse Equations:
/* Output signals change value at transitions in P_CLK.
   "Previous Value of X" is value of output signal after
   the last transition of P_CLK
*/
FLUSH
    When CNT=43,    Set FLUSH= 1
    Otherwise,      Set FLUSH= 0
GATE:
    When CNT=0,     Set GATE= 1
    When G4=1,      Set GATE= 0
    Otherwise,      Set GATE= Previous Value of GATE
G2F
    Set G2F= G2 AND G4
DTA_VALID
    If G2=0 AND (Previous Value of G2F=1)
        Set DTA_VALID=1
        Set FLUSH=0
    When CNT=43
        If GATE=1, Set DTA_VALID=0  /* # data edges <2 */
        If G4=1,   Set DTA_VALID=0  /* # data edges <4 */
    Otherwise, Set DTA_VALID=Previous Value of DTA_VALID
DATA_VALID
    When CNT=37, 38, or 39, Set DATA_VALID=0
    Otherwise, Set DATA_VALID=Previous Value
    of DTA_VALID
CMP_STB
    When CNT=37,
        If DTA_VALID=1, Set CMP STB=0 /* enable CMP_STB */
    Otherwise, Set CMP_STB=1    /* disable CMP_STB */
DUMP
    When CNT=39, 40, 41, 42 or 43, Set DUMP=1
    Otherwise, Set DUMP=0

What is claimed is:

1. A phase error processor for use in a data recovery circuit, comprising:
   a time slot decoder which receives a cyclic clock signal and generates timing signals defining a data processing window of N clock cycles, where N is a positive integer;
   an integration circuit, coupled to said time slot decoder, which receives proportionate phase error information from a phase detector for each data transition in a data signal, said integration circuit integrating said proportionate phase error information for a predetermined number of data transitions during each data processing window; and
   comparator means, coupled to said integration circuit and said time slot decoder, for comparing said integrated proportionate phase error information with a reference signal and generating an Up/Down signal in accordance with said comparison once each data processing window.

2. The phase error processor of claim 1, wherein said integration circuit integrates said proportionate phase error information for a pair of adjacent positive and negative data transitions in said data signal during each data processing window.

3. The phase error processor of claim 1, wherein said integration circuit integrates said proportionate phase error information for at least one pair of adjacent positive and negative data transitions in said data signal during each data processing window.

4. The phase error processor of claim 1, including means for generating a data valid signal whenever said data signal contains at least a predefined number of data transitions during a data processing window.

5. The phase error processor of claim 1, including a gating circuit that filters the proportionate phase error information received by said integration circuit from said phase detector, said gating circuit allowing no more than a predefined number of proportionate phase error information signals, from a corresponding number of data signal transitions, to propagate to said integration circuit during each said data processing window.

6. The phase error processor of claim 1, said integration circuit including means for dumping said integrated phase error information once per data processing window so as to prepare for integrating additional phase error information.

7. A phase error processor for use in a data recovery circuit, comprising:
    a time slot decoder that receives a cyclic clock signal and generates timing signals defining a data processing window of N clock cycles, where N is a positive integer;
    a differential integration circuit, coupled to said time slot decoder, which receives proportionate phase error information from a phase detector for each data transition in a data signal; said received proportionate phase error information including a first pulse signal having a pulse width TW1 corresponding to phase error between each data transition in said data signal and a PLL clock signal, and a second pulse signal having a width TW2 that corresponds to a predefined portion of said PLL clock signal's cycle, wherein the difference in the pulse widths of said first and second pulse signals is proportional to said phase error between said data signal and said PLL clock signal;
    said integration circuit including first integrating means for integrating a plurality of said first pulse signals and second integrating means for integrating a corresponding plurality of said second signals during each data processing window; and
    comparator means, coupled to said integration circuit and said time slot decoder, for comparing said first and second integrated pulse signals, and for generating an Up/Down signal in accordance with said comparison once each data processing window.

8. The phase error processor of claim 7, said data signal having alternating positive and negative transitions;
    said first integrating means integrating at least two successive ones of said first pulse signals, corresponding to successive positive and negative transitions in said data signal;
    said second integrating means integrating successive ones of said second pulse signals corresponding to the first pulse signals integrated by said first integrating means; and
    said comparator means, coupled to said first and second integrating means, generating an Up/Down signal corresponding to the difference between said integrated first and second pulse signals.

9. The phase error processor of claim 7, including means for generating a data valid signal whenever said data signal contains at least a predefined number of data transitions during a data processing window.

10. The phase error processor of claim 7, including a gating circuit that filters the proportionate phase error information received by said integration circuit from said phase detector, said gating circuit allowing no more than a predefined number of proportionate phase error information signals, from a corresponding number of data signal transitions, to propagate to said integration circuit during each said data processing window.

11. The phase error processor of claim 7, said integration circuit including means for dumping said integrated phase error information once per data processing window so as to prepare for integrating additional phase error information.

12. A phase error processor for use in a data recovery circuit, comprising:
    a time slot decoder that receives a cyclic clock signal and generates timing signals defining a data processing window of N clock cycles, where N is a positive integer;
    a gating circuit that receives proportionate phase error information from a phase detector for each data transistion in a data signal; said received proportionate phase error information including a first pulse signal having a pulse width TW1 corresponding to phase error between each data transition in said data signal and a PLL clock signal, and a second pulse signal having a width TW2 that corresponds to a predefined portion of said PLL clock signal's cycle, wherein the difference in the pulse widths of said first and second pulse signals is proportional to said phase error between said data signal and said PLL clock signal;
    said gating circuit allowing a predefined number of said first and second pulse signals, from a corresponding number of data signal transitions, to propagate through said gating circuit during each said data processing window; wherein said gating circuit uses identical circuits for gating said first pulse signal and for gating said second pulse signal.

* * * * *